United States Patent [19]

Shimura et al.

[11] Patent Number: 4,524,277
[45] Date of Patent: Jun. 18, 1985

[54] CHARGED PARTICLE BEAM APPARATUS

[75] Inventors: Yoshimasa Shimura; Hideyuki Kakiuchi; Yoshihisa Minamikawa; Katsuhiro Kawasaki, all of Katsuta, Japan

[73] Assignee: Hitachi, Ltd., Tokyo, Japan

[21] Appl. No.: 455,941

[22] Filed: Dec. 16, 1982

[30] Foreign Application Priority Data

Dec. 18, 1981 [JP] Japan ................. 56-205574

[51] Int. Cl.³ .............. G01K 1/08; H01J 3/00
[52] U.S. Cl. ................. 250/397; 250/396 R; 250/491.1
[58] Field of Search ............ 250/397, 491.1, 492.2, 250/396 R; 219/121 EW

[56] References Cited

U.S. PATENT DOCUMENTS 4,000,440  12/1976  Hall et al. ................ 250/397
4,424,448  1/1984  Takigawa et al. ........... 250/397

FOREIGN PATENT DOCUMENTS 114173  9/1979  Japan ................. 250/397

Primary Examiner—Bruce C. Anderson
Attorney, Agent, or Firm—Antonelli, Terry & Wands

[57] ABSTRACT

A charged particle beam apparatus in which a beam of charged particles emitted from a beam source is focussed on a target in a predetermined size and shape through a plurality of aperture members. Each of the aperture members is combined with a respective deflecting unit which effects a two-dimensional scan with the charged particle beam in response to a scan signal supplied thereto. The center axis of the aperture formed in the aperture member is arithmetically determined on the basis of time-based variation in the quantity of the charged particles trapped by the aperture member during the scan operation. Further, deviation of the arithmetically determined center axis of the aperture from a reference axis is determined. The aperture member is slided on a plane extending perpendicularly to the center axis of the aperture to cancel out the deviation.

13 Claims, 9 Drawing Figures

4,524,277

CHARGED PARTICLE BEAM APPARATUS

BACKGROUND OF THE INVENTION

The present invention generally relates to a charged particle beam apparatus and in particular concerns alignment of the center axis of a charged particle beam with that of an aperture in the charged particle beam apparatus.

In the charged particle beam apparatus, an electron beam is commonly used. As a typical application of such charged particle beam apparatus, there may be mentioned an electron beam pattern writing apparatus for forming on a semiconductor wafer a pattern of circuits for fabrication of a semiconductor integrated circuit. The pattern can be formed either by using a mask or by scanning with the electron beam.

The electron beam pattern writing apparatus for forming the circuit patterns by scanning with the electron beam is usually provided with at least two aperture members each having a rectangular aperture formed therein. These two aperture members are adapted to be moved relative to each other in the direction perpendicular to the axis of the electron beam, whereby a minute rectangular aperture image of predetermined size and shape is projected onto a target which may be a semiconductor wafer to be worked. By scanning two-dimensionally the target with the rectangular aperture image (e.g. electron beam of a rectangular cross-section), desired patterns can be formed on the target as if they were stamped.

The electron beam irradiating apparatus of the variably shaped beam type described above which includes plural stages of electron lenses, apertures and deflecting units as well as a number of focusing elements and thus necessarily requires an elongated path for the focusing of the electron beam suffers a serious drawback that the rectangular image focused on the target is likely to be distorted or disturbed due to irregular electric fields produced by deposition of pollutant on the aperture members, the pollutant containing as main components carbon particles produced upon collision of the electrons with floating gas molecules, and/or due to slight mechanical distortions and deformations of the mechanical elements under the influence of variations in temperature or other environmental factors. Heretofore, this kind of problem has been disposed of by manually adjusting appropriately the deflecting direction as well as the intensity of deflection, which however requires a lot of time and provides a major cause for degrading the efficiency of the pattern writing operation. In particular, when the apparatus has been disassembled for the cleaning purpose, difficulty is encountered in attaining or re-establishing the optimally adjusted or aligned state within a reasonably short time even for the skilled person.

SUMMARY OF THE INVENTION

An object of the present invention is to provide a charged particle beam apparatus in which the desired axial alignment can be automatically effected and which can be operated in a stable state for an elongated period with a high degree of accuracy.

In view of the above object, there is provided according to an aspect of the present invention a charged particle beam apparatus which comprises a charged particle beam focusing system composed of electron lenses for focusing the beam of charged particles onto a target, beam deflecting means for scanning two-dimensionally the target with the charged particle beam in combination with aperture members for defining the cross-sectional shape of the charged particle beam and the like, wherein time-based variation (i.e. variation as a function of time) in the amount or quantity of the charged particles trapped by the aperture member is detected as an electric signal which is then processed by a computer to obtain a correction signal. The position of the aperture and/or the beam deflection is controlled with the aid of the correction signal, to thereby allow the aperture image to be focused on the target at a predetermined position with a high accuracy.

DESCRIPTION OF THE PREFERRED EMBODIMENTS

Figure 1:
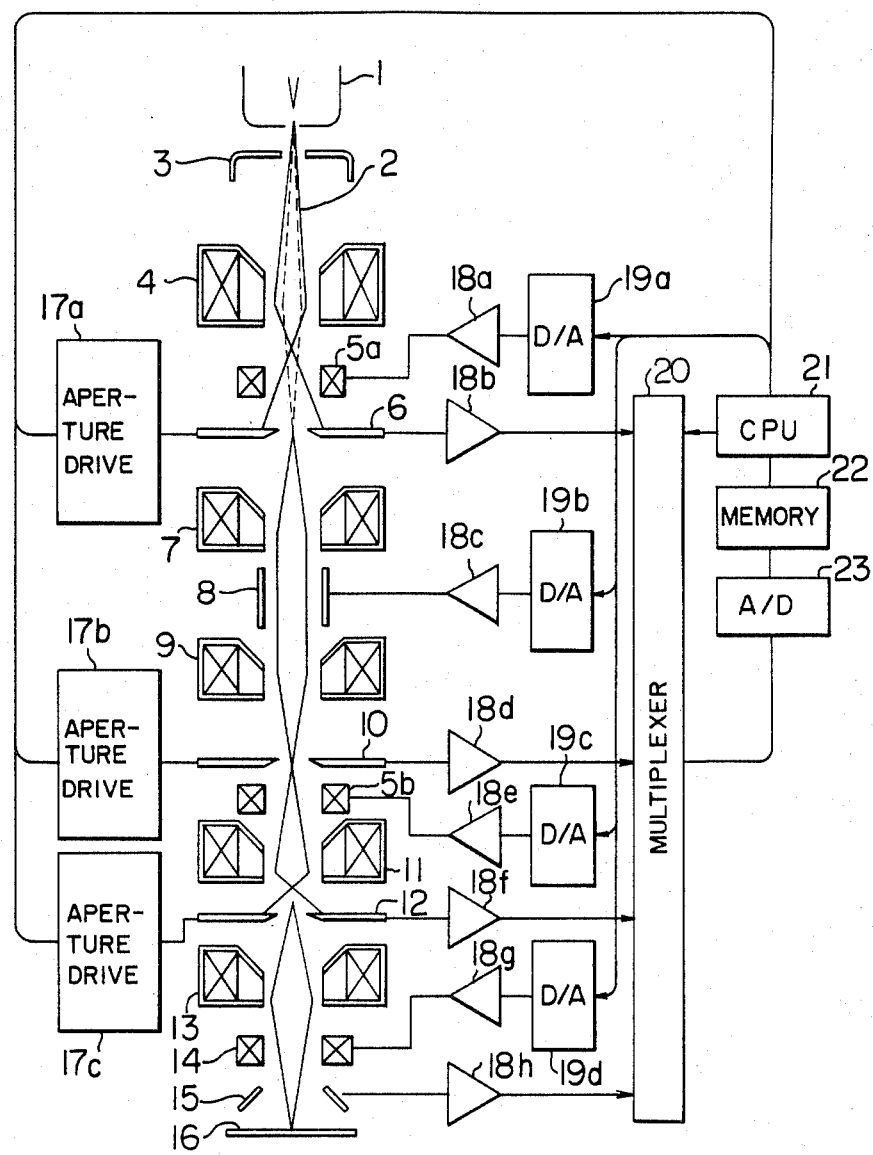
FIG. 1 is a schematic view showing a general arrangement of a charged particle beam apparatus according to an embodiment of the present invention.

FIG. 1 shows a general arrangement of an electron beam focusing system of an electron beam pattern writing apparatus. An electron beam 2 produced by an electron gun 1 and accelerated by an accelerating anode electrode 3 is focused by an electron lens 4. Subsequently, after the beam travelling direction is correctly modified by means of a deflecting coil 5a, a peripheral or marginal portion of the electron beam is intercepted off by an aperture member 6. The electron beam 2 having passed through an aperture formed in the aperture member or plate 6 is collimated by an electron lens 7 and subsequently modified in respect of the travelling direction by deflecting plates 8. The electron beam undergoes convergence upon passing through an electron lens 9 to be focused onto an aperture member 10, whereby the marginal portion of the beam is again cut off.

The apertures formed in the aperture members 6 and 10 are of a rectangular or square form. By displacing the aperture members 6 and 10 relative to each other in the direction perpendicular to the beam axis, the cross-section of the electron beam passing through both the apertures is correspondingly shaped. The travelling direction of the electron beam 2 having a cross-section shaped by the apertures 6 and 10 is modified by a deflecting coil 5b to be focused onto an aperture member 12 by an electron lens 11 as a shaped aperture image. The marginal portion of the electron beam which is likely to be disturbed is again intercepted off by the aperture member 12. Finally, the electron beam is projected onto a target 16 in the form of the shaped aperture image. The target 16 is constituted by an object to be worked with the shaped electron beam. The electron beam is deflected two-dimensionally by a deflecting unit 14 so that the target 16 is scanned by the electron beam in accordance with a predetermined pattern. A reference numeral 15 denotes a reflected electron detector for detecting electrons reflected from the target 16.

With the structure of the electron beam irradiating apparatus of a variable beam section type described above, the target 16 is two-dimensionally scanned by the electron beam of a rectangular or square cross-section shaped by the apertures 6 and 10 under the action of the deflecting coil 14 with the size of the rectangular image being variable by the deflecting plates 8 so as to conform with a pattern to be formed, whereby the desired patterns are successively produced as if they were stamped on the target.

The apparatus for writing a pattern by a beam of charged particles as described above has heretofore been well known. According to the present invention, the charged particle beam writing system of this type is provided with an axis aligning apparatus for aligning the center axis of the charged particle beam with that of the aperture.

In a preferred embodiment of the present invention shown in FIG. 1, currents produced by the electrons trapped by the aperture members 6, 10 and 12 as well as the reflected electron detector 15 are amplified by associated amplifiers 18b, 18d, 18f and 18h, respectively, and supplied to the inputs of a multiplexer 20 which responds to a signal produced by a central control unit or CPU 21 to select one of the outputs from the amplifiers 18b, 18d, 18f and 18h. The selected output signal is supplied to an analogue-to-digital or A/D converter 23. The latter may be constituted by a slice circuit operative on the basis of a single threshold value to produce the output signal of a certain logic level. The output signals from the A/D converter 23 are stored in a memory 22 at addresses which correspond to the scanning positions of the electron beam deflected in accordance with the scan signals supplied to the deflecting units 5a, 5b and 14 from the CPU 21. These scan signals are produced by the CPU 21 and converted into corresponding analogue signals through digital-to-analogue or D/A converters 19a, 19c and 19d to be supplied to the deflecting coils 5a, 5b and 14, respectively. The CPU 21 processes arithmetically data read out from the memory 22 to prepare drive command signals supplied to aperture member driving mechanism 17a, 17b and/or 17c for performing at first a rough adjustment to align the center axis of the associated aperture with the center axis of the electron beam. Subsequently, the CPU 21 supplies a correction signal to the deflecting coil 5a, 5b or 14 through the D/A converters 19a, 19c or 19d and the amplifiers 18a, 18c or 18g, respectively. In this way, fine axial alignment of the aperture is effected sequentially in the order of the apertures 6, 10 and 12 starting from the aperture 6 located nearest to the electron gun 1. The deflecting plates 8 are also supplied with a deflecting signal from the CPU 21 by way of the D/A converter 19b and an amplifier 18c.

Figure 2:
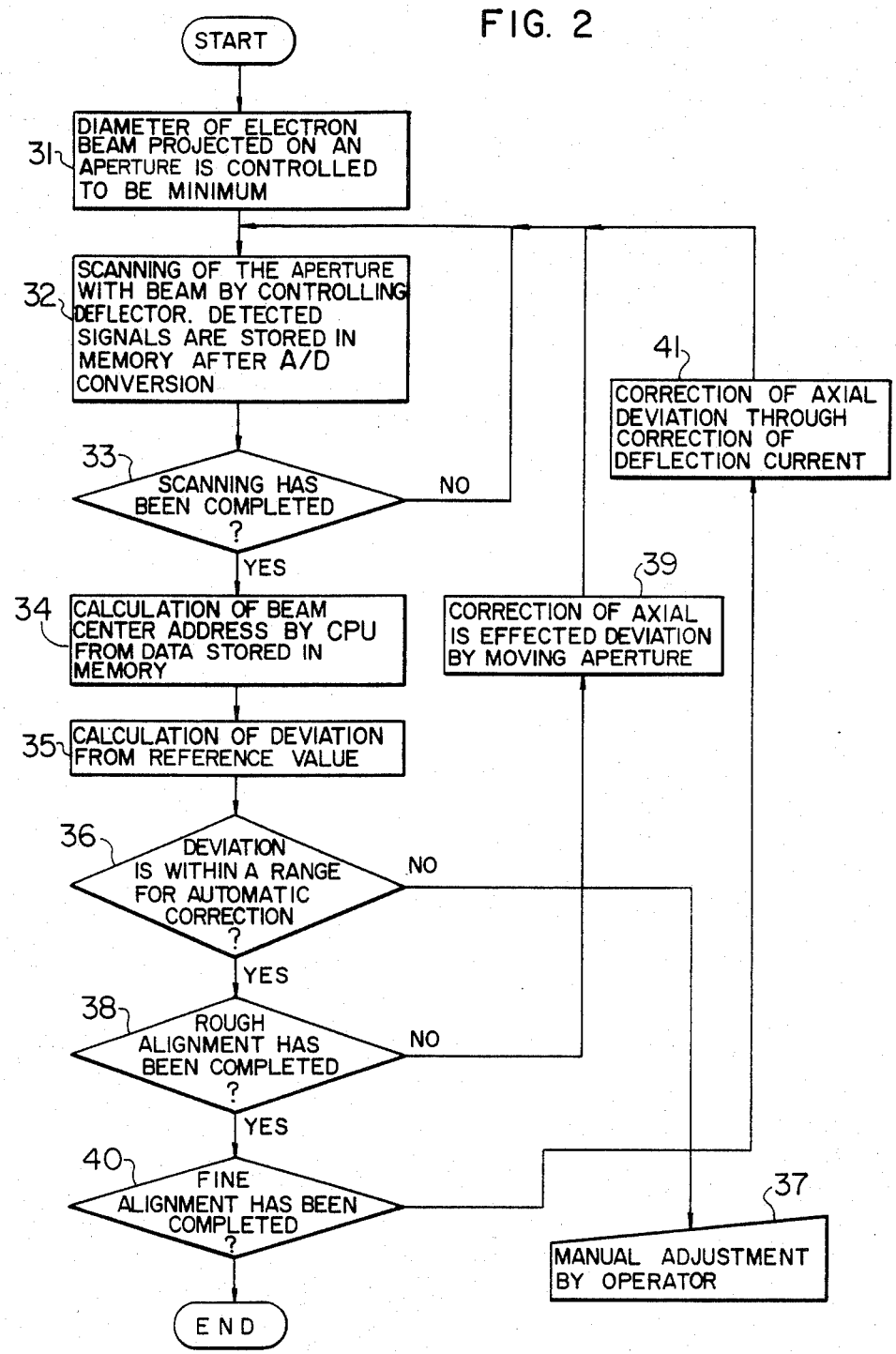
FIG. 2 shows a flow chart for illustrating operations of main parts of the apparatus according to the invention.

Next, an automatic axis aligning operation effected under the control of the CPU 21 will be described in detail by referring to FIG. 2.

Figure 3:
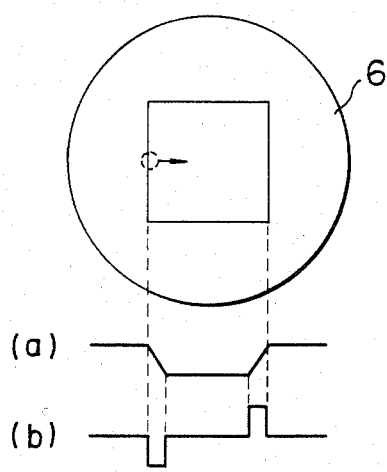
FIG. 3 is a view for schematically illustrating a process for setting the diameter of a charged particle beam at a minimum value.
Figure 4:
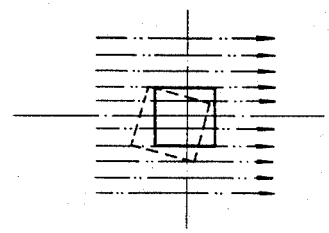
FIG. 4 is a schematic view illustrating a positional relationship between an aperture and the direction in which scan is effected with the charged particle beam.
Figure 5:
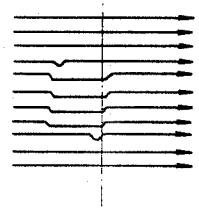
FIG. 5 is a schematic view showing waveforms of signals outputted from a detector upon every scanning effected with the charged particle beam in the manner shown in FIG. 4.
Figure 6:
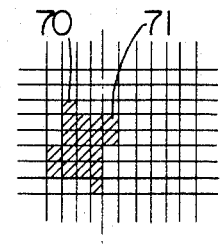
FIG. 6 is a view illustrating conceptionally storage of the detection signals in a memory in accordance with levels of the detection signals.
Figure 7:
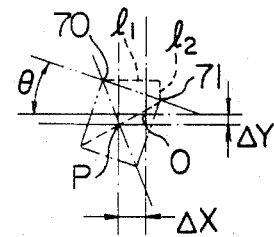
FIG. 7 graphically illustrates a manner in which a correction value is determined.

For convenience of description, it is assumed that the alignment is to be effected for the deflecting coil 5a and the aperture 6 in combination. At first, the electron beam is so adjusted by correspondingly controlling excitation of the electron lens 4 that the diameter of the electron beam may be minimum at the position of the aperture 6. More particularly, when the electron beam is linearly deflected by the deflecting coil 5a, as is illustrated in FIG. 3, there is produced at the output of the amplifier 18a a signal of waveform which has a leading ramp and a trailing ramp of the width determined in accordance with the diameter of the electron beam, as is illustrated at (a) in FIG. 3. This signal is stored in the memory 22 and converted into differentiated waveforms or pulses (shown at (b) in FIG. 3) by the CPU 21. The width (pulse duration) of this pulse is detected as a parameter representative of the beam diameter. Accordingly, the excitation current of the electron lens 4 is so set that the pulse width in consideration becomes minimum. Next, at a step 32, the aperture member 6 is scanned by the electron beam under the deflecting action of the deflection coil 5a in such a manner as indicated by double-dotted broken lines in FIG. 4. The current produced by electrons caught by the aperture member or plate 6 in the course of the beam scanning operation is amplified by the amplifier 18b and converted into a corresponding digital value by the A/D converter 23 to be stored in the memory 22. In this connection, it will be appreciated that when the aperture 6 is inclined relative to the scan direction of the electron beam in such a manner as indicated by a broken line square in FIG. 4, the electric signals produced at the amplifier 18b for every scan line are of such waveforms as illustrated in FIG. 5. Thus, when the digital values outputted by the A/D converter 23 and corresponding to these waveforms are stored in the memory 22, a pattern memorized in the memory 22 is conceptionally similar to the shape of the aperture, as is shown in FIG. 6, in which hatched areas correspond to the detected signals of zero level. When it is determined at the step 33 that the scan operation has been completed, data is read out from the memory 22 at a succeeding step 34, whereby the position of the center axis of the aperture 6 is arithmetically determined by the CPU 21 on the basis of coordinate values of four corner locations of the stored aperture pattern. Subsequently, deviation of the center axis of the aperture from the standard or reference coordinate position previously established for the center axis of the electron beam is arithmetically determined at a step 35. This deviation is given by x- and y-coordinates $\Delta x$ and $\Delta y$ of the center axis position P of the aperture relative to the reference position O, as is illustrated in FIG. 7. At a step 36, it is decided whether or not the deviation in question lies within a range in which automatic correction of the deviation can be effected. When the decision turns out to be negative (i.e. NO), indicating that the automatic correction is impossible, the procedure procedes to a step 37 where the axial alignment is manually effected by operator so that deviation is reduced to such a value for which the automatic correction may be effected. On the other hand, when the decision made at the step 36 has proven to be affirmative (i.e. YES), it is determined at a step 38 whether the rough adjustment has been completed. This can be accomplished by checking whether the deviation calculated at the step 35 is reduced below a predetermined value. When the determination results in "NO", the aperture 6 is moved by a distance corresponding to the deviation.

Figure 8:
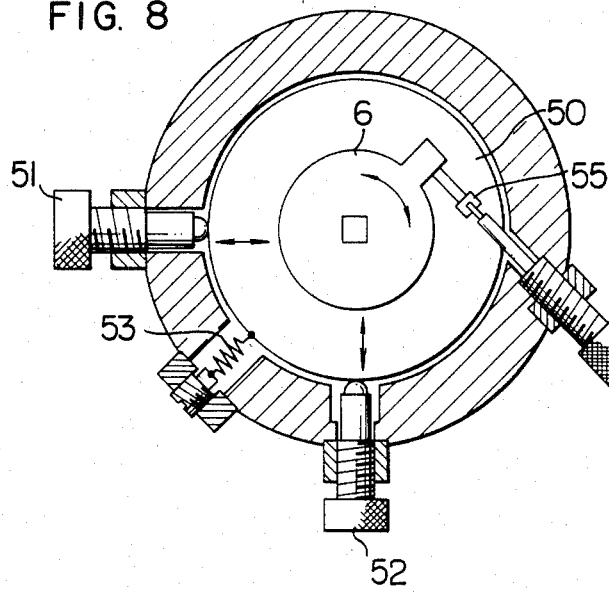
FIG. 8 shows a structure of an aperture member driving mechanism.

Next, description will be made on the aperture member driving mechanism 17a, by way of example, by referring to FIG. 8. The aperture member 6 is disposed on an aperture rotating table 50 which is supported through cooperation of an x-adjusting screw 51 and a y-adjusting screw 52 under a pulling force exerted by a spring 53 disposed in the direction corresponding to the bisector line between the x-axis and the y-axis. It will be appreciated that the center axis of the aperture 6 can be aligned with the center axis of the electron beam by correspondingly adjusting the x-adjusting screw 51 and the y-adjusting screw 52 under the pulling force exerted by the spring 53.

The aperture member 6 can be rotated on the aperture supporting table 50 by means of a rotating screw 54 through a flexible joint 55. These screws 51, 52 and 54 serve for the fine movement and adapted to be driven by respective step motors which are driven in response to the control pulses supplied by the CPU 21, to thereby effect the adjustment of the position of the aperture 6.

After the correction of the off-axis deviation made at the step 39, the procedure including the steps 32 to 36 is repeated. In succession to the step 38 at which the decision results in "YES", it is determined at the step 40 whether the fine adjustment has also been completed. This can be accomplished by checking whether the deviation calculated at the step 35 lies within the maximal tolerance range. If the decision made at the step 38 turns out to be "NO", a minute off-axis deviation which is difficult to be mechanically corrected by means of the aperture driving mechanism is then compensated by correspondingly modifying the deflecting current of the deflection coil 5a to attain the perfect axial alignment (fine adjustment). After the correction of the off-axis correction made at the step 41, the procedure including the step 32 to 38 is executed. When the decision made at the step 40 turns out to be "YES", the automatic alignment has been completed.

When the automatic axial alignment has been accomplished for the aperture 6 in this way, the same procedure is successively carried out for the apertures 10 and 12, respectively, to thereby complete the axial alignment for the whole electron beam pattern writing apparatus.

In the following, description will be made on the correction of angular deviations of the apertures in the rotational direction.

Figure 9:
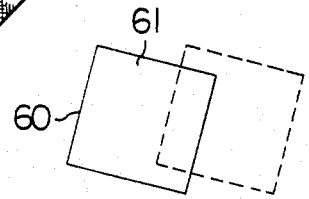
FIG. 9 is a view for illustrating a process of detecting an angular position of an aperture image.

At first, the diameter of the electron beam is set sufficiently large for the aperture to be covered by the cross-section of the electron beam. The aperture image formed by the apertures 6 and 10 at that time is focused onto the target 16. The aperture image thus projected onto the target 16 is not always so orientated that no inclination is involved to the direction in which the scanning is effected by the deflection coil 14. Accordingly, when the automatic axial alignment has been completed for all the apertures 6, 10 and 12, the correction of the angular position of the apertures is carried out to make zero the inclination of the shaped aperture image relative to the direction in which the beam scanning is to be effected by the deflection coil 14. For correcting the angular deviation, the aperture image 60 is at first formed on the target 16, while a piece of reflecting material 61 such as gold of a sufficiently smaller size than that of the aperture image is placed on the target 16 at the center, as is shown in FIG. 9. Electrons reflected by the reflecting detection material 61 are detected by the reflected electron detector 15, the output current signal of which is converted into a corresponding digital value by means of the A/D converter 23 to be stored in the memory 22. When the target is scanned two-dimensionally with the electron beam under the deflecting action of the deflection coil 14, the detection current makes appearance at the output of the reflected electron detector 15 so far as the reflecting material 61 is irradiated with the aperture image 60. However, when the reflecting material 61 is not covered by the aperture image 60, as is indicated by a broken line square, no current is produced by the reflected electron detector 15. In this case, there is stored in the memory 22 a pattern which is similar to that shown in FIG. 6 except that the hatched areas correspond to the detected signals of high level reversely to the detection signals derived from the aperture members described hereinbefore. Accordingly, lengths $l_1$ and $l_2$ shown in FIG. 7 can be arithmetically determined on the basis of the addresses of the memory 22 at which coordinates corresponding to end positions 70 and 71 of the upper side of the rectangular aperture image are stored, and hence the rotational angle $\theta$ (FIG. 7) can be arithmetically determined in accordance with a formula: $\theta = \tan^{-1}(l_2/l_1)$ This rotational angle $\theta$ represents the angular deviation which can be cancelled out by correspondingly driving the rotating screw 54 (FIG. 8) through the aperture driving mechanism.

As will be appreciated from the foregoing description, a precisely shaped square or rectangular aperture image can be formed on the target by arithmetically determining the off-axis deviations $\Delta x$ and $\Delta y$ as well as the angular deviation from the reference axis on the basis of the pattern shown in FIG. 7 and controlling the aperture driving mechanisms 17 through the feedback control loop so that the deviations mentioned above are compensated. In this connection, it should be mentioned that the correction of the off-axis deviations $\Delta x$ and $\Delta y$ of the aperture image can also be accomplished solely by correspondingly controlling the deflecting current of the deflection coil 5.

In the foregoing, description has been made on the assumption that the present invention is applied to the electron beam pattern writing apparatus. However, it will be readily appreciated that the invention may equally be applied to other apparatus such as scanning electron microscope where scanning by an electron beam or charged particle beam in general is made use of.

The automatic axial aligning apparatus for a charged particle beam focusing system according to the present invention allows the alignment to be accomplished at a high degree of accuracy with a significantly improved efficiency independent of the degree of skillfulness of the operator, to a great advantage.

We claim:

1. A charged particle beam apparatus, comprising:
  a source for a beam of charged particles;
  an electron lens system for focusing the beam of charged particles emitted by said charged particle beam source;
  at least a combination of deflecting means for deflecting said charged particle beam and an aperture member having an aperture through which said charged particle beam is passed;

a scanning signal source for supplying a scan signal to said deflecting means to thereby perform a two-dimensional scan with said charged particle beam; and axis aligning means for correctively adjusting said combination in such a manner that the center axis of said aperture coincides with the center axis of said charged particle beam performing no scan, said adjustment being made on the basis of time-based variation in the quantity of the charged particles trapped by said aperture member when scanning with said charged particle beam is being performed in response to said scan signal, said axis aligning means including first means for detecting the quantity of the charged particles caught by said aperture member in terms of an electric signal, second means for determining the position of the center axis of said aperture on the basis of time-based variation in said electric signal, third means for arithmethically determining deviation of said center axis position of said aperture determined by said second means from said axis position of said charged particle beam, and fourth means for correctively adjusting said combination on the basis of the deviation determined by said third means.

2. A charged particle beam apparatus according to claim 1, wherein the position of the center axis of said charged particle beam is a predetermined reference position.

3. A charged particle beam apparatus according to claim 1, wherein said third means includes storage means for storing values corresponding to the electric signals delivered by said detecting means, and means for arithmetically determining the position of the center axis of said aperture on the basis of the values stored in said storage means.

4. A charged particle beam apparatus according to claim 3, wherein said storage means includes an analogue-to-digital converter for converting the electric signals delivered by said detecting means into corresponding digital values, and a memory for storing therein said digital values.

5. A charged particle beam apparatus according to claim 3, wherein said storage means includes means for slicing said electric signal delivered by said detecting means and a memory for storing logic levels obtained from said slicing means.

6. A charged particle beam apparatus according to claim 4, wherein said storing means stores said digital values in a pattern corresponding to the scanning pattern of said charged particle beam.

7. A charged particle beam apparatus according to claim 1, wherein said fourth means includes an aperture member driving means for moving said aperture member.

8. A charged particle beam apparatus according to claim 7, wherein said aperture member driving mechanism is constituted by a sliding mechanism for causing said aperture member to slide on a plane extending perpendicularly to the center axis of said aperture.

9. A charged particle beam apparatus according to claim 1, wherein said fourth means is further so arranged to superpose a corresponding correcting signal on the deflecting signal supplied to said deflecting means.

10. A charged particle beam apparatus according to claim 1, wherein said fourth means includes rough adjusting means for carrying out the axial alignment by moving said aperture, and fine adjusting means for carrying out fine axial alignment by correcting the deflecting signal applied to said deflecting means.

11. A charged particle beam apparatus according to claim 1, wherein a plurality of said combinations are provided, said first means including a multiplexer for selectively detecting the quantity of charged particles caught by the aperture members of said combinations, respectively.

12. A charged particle beam apparatus according to claim 1, wherein said aperture is of a rectangular form, further including an electron lens for focusing the image of said aperture on a target, a reflecting material having a sufficiently smaller size than said aperture image and disposed on said target, a deflecting unit for scanning two-dimensionally said aperture image on said target with the charged particle beam, a detector for catching charged particles reflected from said detection material, means for arithmetically determining an angle of rotational deviation of said aperture on the basis of an electric signal supplied by said detector, and means for correcting for said rotational deviation angle as arithmetically determined.

13. A charged particle beam appartus according to claim 1, wherein said fourth means includes means for moving said aperture member so as to position the center axis of said aperture to coincide with the center axis of said charged particle beam performing no scan.

* * * * *